United States Patent
Han

(10) Patent No.: US 7,023,529 B2
(45) Date of Patent: Apr. 4, 2006

(54) METHOD FOR OVERLAY MEASUREMENT IN EXPOSURE PROCESS

(75) Inventor: Sang-Il Han, Seoul (KR)

(73) Assignee: Samsung Electronics Co., Ltd., (KR)

( * ) Notice: Subject to any disclaimer, the term of this patent is extended or adjusted under 35 U.S.C. 154(b) by 112 days.

(21) Appl. No.: 10/748,855

(22) Filed: Dec. 29, 2003

(65) Prior Publication Data

US 2004/0174513 A1    Sep. 9, 2004

(30) Foreign Application Priority Data

Jan. 9, 2003   (KR) ...................... 10-2003-0001342

(51) Int. Cl.
   G03B 27/72    (2006.01)
   G03B 27/42    (2006.01)

(52) U.S. Cl. .......................... 355/71; 355/53

(58) Field of Classification Search ................ 356/401, 356/400, 399; 355/53, 67, 71
   See application file for complete search history.

(56) References Cited

U.S. PATENT DOCUMENTS

| | | | |
|---|---|---|---|
| 5,767,949 A | 6/1998 | Noguchi et al. | 355/67 |
| 6,115,108 A | 9/2000 | Capodieci | 355/77 |
| 6,151,121 A * | 11/2000 | Mishima | 356/399 |
| 6,219,130 B1 * | 4/2001 | Kawakubo | 355/67 |

FOREIGN PATENT DOCUMENTS

| | | |
|---|---|---|
| JP | 7230945 | 8/1995 |
| JP | 08-083761 | 3/1996 |
| JP | 9237744 | 9/1997 |
| JP | 10-022193 | 1/1998 |
| JP | 10-209016 | 8/1998 |
| KR | 2001/0009225 | 2/2001 |
| KR | 2001-0017687 | 3/2001 |
| KR | 2001/0087005 | 9/2001 |

* cited by examiner

Primary Examiner—Peter B. Kim
(74) Attorney, Agent, or Firm—F. Chau & Associates LLC

(57) ABSTRACT

A method for overlay measurement in an exposure process uses a multiplex filter having a plurality of filters. A first filter is selected from the plurality of filters and positioned underneath a lens of an overlay measurement apparatus. Next, a determination is made whether overlay marks formed on a wafer are perceptible through the lens and the first filter. If perceptible, the overlay marks are measured. If the overlay marks are not perceptible, the first filter is replaced with a second filter from the plurality of filters, and a determination is made whether the overlay marks are perceptible through the second filter and, if perceptible, the overlay marks are measured. Accordingly, there is no need to stop the exposure process if there is a failure to perceive the overlay marks. Further, the method, according to an embodiment of the present invention, increases the efficiency of the exposure process, especially, the wafer alignment process.

20 Claims, 3 Drawing Sheets

METHOD FOR OVERLAY MEASUREMENT IN EXPOSURE PROCESS

BACKGROUND OF THE INVENTION

1. Technical Field

The present invention relates generally to photolithography technology used for wafer fabrication, and more particularly, to a method for pattern overlay measurement using a multiplex filter with several color filters in the exposure process.

2. Discussion of the Related Art

Wafer fabrication encompasses many manufacturing processes that create the semiconductor device, i.e., integrated circuits, in and on a wafer. Circuit formation in and on the wafer requires much layering and patterning. With layering, thin layers of different materials are grown on or added to a surface of the wafer. After the wafer is layered, selected portions of the layer are removed, leaving a pattern remaining on the wafer. This patterning process is called photolithography.

In photolithography, a specific pattern preformed on a mask is transferred to a layer on the wafer surface by imaging the pattern onto a photoresist which overlies the layer. This imaging process is referred to as the exposure process.

The initial step of the exposure process is a precise alignment of the wafer with the mask. Overlay measurement is routinely performed to verify the proper alignment. For the overlay measurement, overlay marks are preformed in the layer on the wafer and in the mask. The overlay measurement optically measures the relative positions of the overlay marks in different layers on the wafer and on the mask.

FIG. 1 schematically shows a known apparatus 100 for performing the overlay measurement. Referring to FIG. 1, the overlay measurement apparatus 100 includes a wafer table 30 on which the wafer 40 is mounted, a lens 10 used to produce an image of the overlay mark formed on the wafer 40, and a multiplex filter 20 used to select wavelengths of light rays passing through the lens 10 according to surface conditions of the wafer 40.

The multiplex filter 20 is schematically shown in a plan view of FIG. 2. As shown in FIG. 2, the multiplex filter 20 is composed of a filter body 21 having a disk-like shape, and six color filters 23a, 23b, 23c, 23d, 23e and 23f having different colors, such as red, green, orange, blue, yellow and white. For example, these color filters are arranged in order of the green filter 23b, the orange filter 23c, the blue filter 23d, the yellow filter 23e and the white filter 23f, in a clockwise direction, starting from the red filter 23a.

During measurement of the overlay marks, the ability to perceive the overlay marks may vary depending on surface conditions of the layers in which the overlay marks are formed. Accordingly, to perceive the overlay marks well, light rays with a specific wavelength are required. Each color filter allows passing of light rays having a desired wavelength.

FIG. 3 illustrates, in a flow diagram, a conventional method 50 for overlay measurement during the exposure process. Referring to FIG. 3 together with FIGS. 1 and 2, in a first step 51, a human operator selects a specific color filter 23 suitable for measuring the overlay marks on the wafer 40 and then fixes the multiplex filter 20 to the apparatus 100.

A next step 52 is to attempt to perceive the overlay marks on the wafer 40 through the lens 10. If the operator is able to perceive the overlay marks, the operator measures the overlay marks on the wafer 40 through the lens 10 (step 53). Next, the operator analyzes measured values of the overlay marks (step 54), and calculates analyzed results (step 55). Calculated data is then fed into the overlay measurement apparatus 100 (step 56). If the operator is not able to perceive the overlay marks in the step 52, the operator acknowledges errors in measuring (step 57) and stops the exposure process (step 58).

Such errors in measuring may be caused by failing to perceive the overlay marks due to irregular wafer surfaces. As the wafer diameter increases to, for example, twelve inches, a difference in thickness between central regions and peripheral regions of the wafer becomes greater, especially, after a chemical mechanical polishing (CMP) process. As a result, the overlay marks may differ in height as well, depending on surface conditions of the regions where the overlay marks are formed. The fixed color filter cannot be used to perceive all overlay marks having different heights, which results in perception failure of the overlay marks and resultant measuring errors.

SUMMARY OF THE INVENTION

A method for overlay measurement using a multiplex filter, in accordance with an embodiment of the present invention, includes selecting a first filter from a plurality of filters and positioning the first filter underneath a lens of an overlay measurement apparatus, determining whether overlay marks formed on a wafer are perceptible through the lens and the first filter, measuring the overlay marks if the overlay marks are perceptible, and replacing the first filter with a second filter from the plurality of filters if the overlay marks are not perceptible through the first filter.

In alternate embodiments, the method may further include determining whether the overlay marks are perceptible through the lens and the second filter, and measuring the overlay marks if the overlay marks are perceptible through the second filter.

The method may also include analyzing measured values of the overlay marks, calculating results of the analysis of the measured values, and feeding calculated data into the overlay measurement apparatus.

The method may also include stopping the method if the overlay marks are not perceptible through each filter from the plurality of filters.

The filters may be color filters and include yellow, green and red filters. Further, the first filter may be the yellow filter, and the second filter may be the green filter or the red filter.

The method may further include replacing the second filter with a third filter from the plurality of filters if the overlay marks are not perceptible through the second filter, and continuously replacing each of successive replacement filters with an unused filter from the plurality of filters until the overlay marks are perceptible through one of the replacement filters or each one of the plurality of filters has been used.

The multiplex filter may include the plurality of filters positioned thereon and the step of replacing may be performed by rotating the multiplex filter and may be performed automatically.

Another method for overlay measurement, in accordance with an embodiment of the present invention, includes selecting a first filter from a plurality of filters and positioning the first filter on an overlay measurement apparatus, determining whether overlay marks formed on a semiconductor surface are able to be measured using the first filter, measuring the overlay marks if the overlay marks are able to be measured, and replacing the first filter with a second filter from the plurality of filters if the overlay marks are not able to be measured using the first filter.

In alternate embodiments, the method may further include determining whether the overlay marks are able to be measured using the second filter, and measuring the overlay marks if the overlay marks are able to be measured using the second filter. The plurality of filters may include a yellow filter, a green filter and a red filter. The method may further include replacing the second filter with a third filter from the plurality of filters if the overlay marks are not able to be measured using the second filter, and continuously replacing each of successive replacement filters with an unused filter from the plurality of filters until the overlay marks are able to be measured using one of the replacement filters or each one of the plurality of filters has been used. The step of replacing may be performed by automatic rotation a multiplex filter including the plurality of filters.

Another method for overlay measurement, in accordance with an embodiment of the present invention, includes using a plurality of filters in conjunction with an overlay measurement apparatus to perceive overlay marks on a semiconductor surface, and measuring perceptible overlay marks.

Each filter of the plurality of filters may be alternately positioned in line with a lens of the overlay measurement apparatus.

BRIEF DESCRIPTION OF THE DRAWINGS

Preferred embodiments of the invention can be understood in more detail from the following descriptions taken in conjunction with the accompanying drawings in which.

DETAILED DESCRIPTION OF THE PREFERRED EMBODIMENTS

Preferred embodiments of the present invention will be described below in more detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the description, known structures and processes have not been shown in detail to avoid obscuring embodiments of the present invention. It will be appreciated that for simplicity and clarity of illustration, some elements illustrated in the figures have not necessarily been drawn to scale. For example, the dimensions of some of the elements are exaggerated relative to other elements for clarity.

Figure 4:
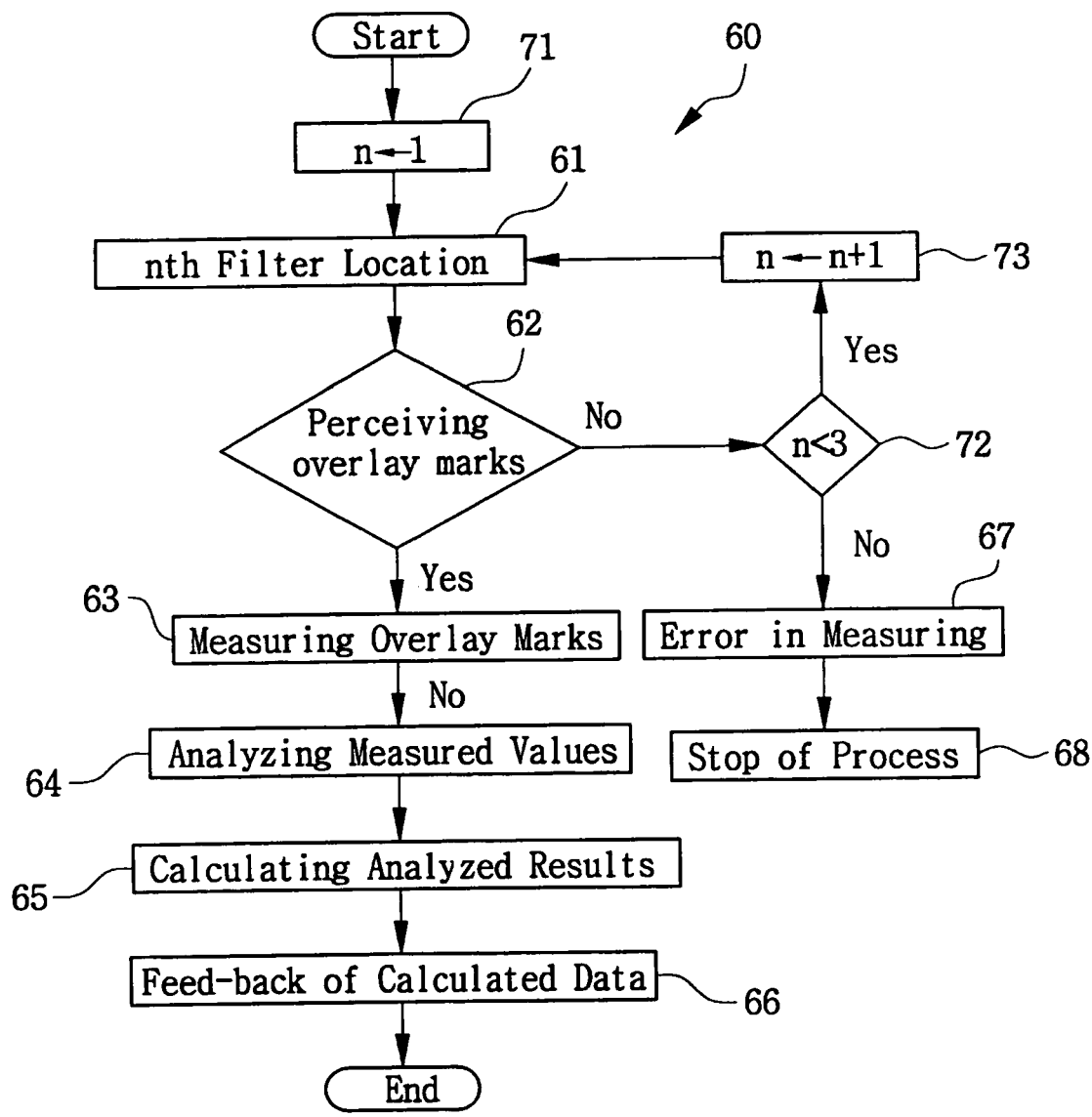
FIG. 4 is a flow diagram illustrating a method for overlay measurement in accordance with an embodiment of the present invention.

FIG. 4 illustrates, in a flow diagram, a method 60 for an overlay measurement in accordance with an embodiment of the present invention. The overlay measurement method 60 of this embodiment may be performed using known devices, for example, the apparatus 100 and the multiplex filter 20 shown in FIGS. 1 and 2, respectively. However, unlike the conventional method, the overlay measurement method 60 permits an automatic change of color filters 23 in the case of measuring errors.

Figure 1:
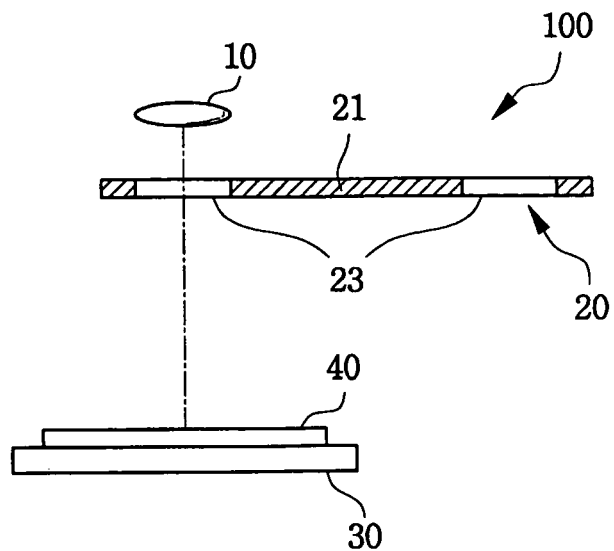
FIG. 1 is a view schematically showing a known apparatus for overlay measurement.
Figure 2:
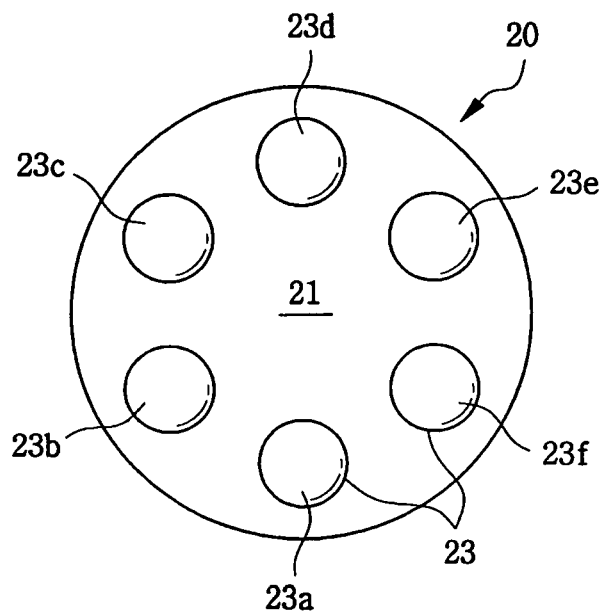
FIG. 2 is a plan view showing a multiplex filter of a known overlay measurement apparatus.
Figure 3:
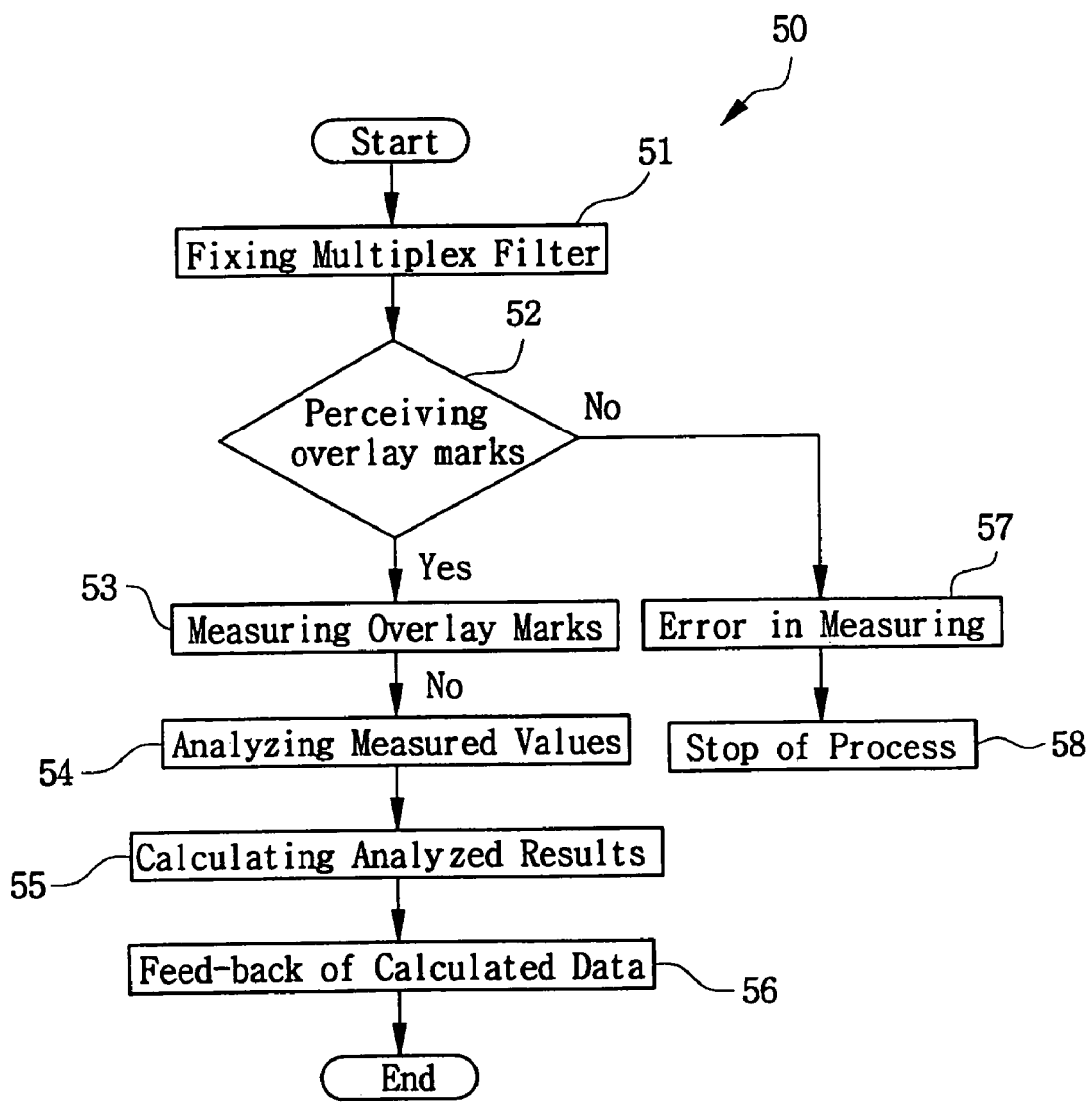
FIG. 3 is a flow diagram illustrating a conventional method for overlay measurement.

Referring to FIG. 4 together with FIGS. 1 and 2, the overlay measuring method 60 starts with selecting a color filter 23 for measuring the overlay marks on the wafer 40 and then fixing the multiplex filter 20 so that the selected color filter 23 is located underneath the lens 10 (step 61). The selected color filter 23 is referred to as a first filter. In FIG. 4, a reference character 'n' means natural numbers representing the order of the color filters 23. For example, 'n←1' refers to the first color filter and 'n←n+1' refers to subsequent filters. Preferably, the first filter may be a yellow filter 23e that has advantages of transmitting several wavelengths, adapting to various layer conditions, and obtaining an average image.

Next, a human operator attempts to perceive the overlay marks on the wafer 40 through the lens 10 and the first filter 23 (step 62). If the operator is able to perceive the overlay marks, the operator measures the overlay marks on the wafer 40 through the lens 10 and the first filter 23 (step 63). The operator then analyzes measured values of the overlay marks (step 64), and calculates analyzed results (step 65). Calculated data is then fed into the overlay measurement apparatus (step 66).

If the operator fails to perceive the overlay marks through the lens 10 by using the first filter 23 in the step 62, the color filter 23 is replaced with another color filter 23. That is, another color filter 23 is alternatively positioned underneath the lens 10 by an automatic rotation of the multiplex filter 20 (step 61). An automatic change of the color filter 23 may be performed by programming the apparatus 100.

The changed color filter 23 is referred to as a second filter 23. In FIG. 4, 'n<3' of step 72 means a determination is made whether the order of the changed color filter is smaller than the third color filter. Therefore, in accordance with an embodiment of the present invention, three color filters can be used (i.e., an initial selection and two filter changes) before an error determination (step 67). Alternatively, since the multiplex filter 20 has, for example, six filters, all six color filters can be used (i.e., an initial selection and five filter changes) before an error determination.

When the second filter 23 is located underneath the lens 10 by rotation, the above-discussed steps 62 to 66 are performed again in sequence. If the operator fails to perceive the overlay marks when using the second filter 23 (step 62), the second filter 23 is replaced with the third filter 23 (steps 72 and 73). If the first filter is the yellow filter 23e, the next filter used may be the green filter 23b or the red filter 23a. The selection of the color filters 23 may be determined by conditions of the layers in which the overlay marks are formed, the types of the overlay marks, the ways of measuring the overlay marks, and so on. If all programmed filters, for example, three filters in an embodiment, result in a failure to perceive the overlay marks, the operator acknowledges errors in measuring (step 67) and stops the exposure process (step 68).

As described above, the overlay measurement method of an embodiment of the present invention permits an automatic change of the color filters when there is a failure to perceive overlay marks. Accordingly, there is no need to stop the exposure process when such failure occurs. Further, the method according to an embodiment of the present invention increases the efficiency of the exposure process, especially, the wafer alignment process.

Although the illustrative embodiments have been described herein with reference to the accompanying drawings, it is to be understood by those skilled in the art that various changes in form and details may be made without departing from the spirit and scope of the invention as defined by the appended claims.

What is claimed is:

1. A method for overlay measurement using a multiplex filter, comprising:
   selecting a first filter from a plurality of filters and positioning the first filter underneath a lens of an overlay measurement apparatus;
   determining whether overlay marks formed on a wafer are perceptible through the lens and the first filter;
   measuring the overlay marks if the overlay marks are perceptible;
   replacing the first filter with a second filter from the plurality of filters if the overlay marks are not perceptible through the first filter; and
   stopping the method and making an error determination after failing to perceive the overlay marks through a predetermined number of filters.

2. The method of claim 1, further comprising:
   determining whether the overlay marks are perceptible through the lens and the second filter; and
   measuring the overlay marks if the overlay marks are perceptible through the second filter.

3. The method of claim 1, further comprising:
   analyzing measured values of the overlay marks;
   calculating results of the analysis of the measured values; and
   feeding calculated data into the overlay measurement apparatus.

4. The method of claim 1, wherein the predetermined number is equal to the total number of the plurality of filters.

5. The method of claim 1, wherein the predetermined number is equal to less than the total number of the plurality of filters.

6. The method of claim 1, wherein the plurality of filters includes a yellow filter, a green filter and a red filter.

7. The method of claim 6, wherein the first filter is the yellow filter.

8. The method of claim 6, wherein the second filter is one of the green filter and the red filter.

9. The method of claim 1, further comprising replacing the second filter with a third filter from the plurality of filters if the overlay marks are not perceptible through the second filter.

10. The method of claim 1, further comprising continuously replacing each of successive replacement filters with an unused filter from the plurality of filters until the overlay marks are perceptible through one of the replacement filters or the predetermined number of filters has been used.

11. The method of claim 1, wherein the multiplex filter includes the plurality of filters positioned thereon and the step of replacing is performed by rotating the multiplex filter.

12. The method of claim 1, wherein the step of replacing is performed automatically.

13. A method for overlay measurement, comprising:
   selecting a first filter from a plurality of filters and positioning the first filter on an overlay measurement apparatus;
   determining whether overlay marks formed on a semiconductor surface are able to be measured using the first filter;
   measuring the overlay marks if the overlay marks are able to be measured;
   replacing the first filter with a second filter from the plurality of filters if the overlay marks are not able to be measured using the first filter; and
   stopping the method and making an error determination after failing to measure the overlay marks using a predetermined number of filters.

14. The method of claim 13, further comprising:
   determining whether the overlay marks are able to be measured using the second filter; and
   measuring the overlay marks if the overlay marks are able to be measured using the second filter.

15. The method of claim 13, wherein the plurality of filters includes a yellow filter, a green filter and a red filter.

16. The method of claim 13, further comprising replacing the second filter with a third filter from the plurality of filters if the overlay marks are not able to be measured using the second filter.

17. The method of claim 13, further comprising continuously replacing each of successive replacement filters with an unused filter from the plurality of filters until the overlay marks are able to be measured using one of the replacement filters or the predetermined number of the plurality of filters has been used.

18. The method of claim 13, wherein the step of replacing is performed by automatic rotation of a multiplex filter including the plurality of filters.

19. A method for overlay measurement, comprising:
   using a plurality of filters in conjunction with an overlay measurement apparatus to perceive overlay marks on a semiconductor surface;
   measuring perceptible overlay marks; and
   stopping the method and making an error determination after failing to perceive the overlay marks using a predetermined number of filters.

20. The method of claim 19, wherein each filter of the plurality of filters is alternately positioned in line with a lens of the overlay measurement apparatus.

* * * * *